(12) United States Patent
Chang et al.

(10) Patent No.: US 11,197,390 B1
(45) Date of Patent: Dec. 7, 2021

(54) CLIP FOR SECURING CABLES AND PERFORMING CABLE MAINTENANCE

(71) Applicant: Quanta Computer Inc., Taoyuan (TW)

(72) Inventors: Chun Chang, Taoyuan (TW); Cheng Tseng, Taoyuan (TW); Cheng-Hsiang Huang, Taoyuan (TW); Chih-Hung Yang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/886,633

(22) Filed: May 28, 2020

(51) Int. Cl.
 *H02B 1/20* (2006.01)
 *H05K 7/14* (2006.01)
 *H05K 5/02* (2006.01)

(52) U.S. Cl.
 CPC ......... *H05K 7/1491* (2013.01); *H05K 5/0221* (2013.01); *H05K 5/0239* (2013.01)

(58) Field of Classification Search
 USPC ....................................................... 361/826
 See application file for complete search history.

(56) References Cited

U.S. PATENT DOCUMENTS

| 9,022,814 B2 * | 5/2015 | Fabrykowski | H01R 13/58 439/719 |
| 2009/0189026 A1 * | 7/2009 | Bourgeois | H02G 3/0456 248/70 |

* cited by examiner

*Primary Examiner* — Hung S. Bui
(74) *Attorney, Agent, or Firm* — Nixon Peabody LLP

(57) ABSTRACT

A clip for securing one or more cables in a cable aisle of a computing device comprises a housing portion and a sliding portion. The housing portion has a first sidewall and a second sidewall that are coupled via a base. A cable channel is defined between the first sidewall and the second sidewall. The cable channel is configured to accommodate the one or more cables. The sliding portion is coupled to the first sidewall of the housing portion. The sliding portion has a lifting member extending across the cable channel from the first sidewall to the second sidewall. The sliding portion is configured to be moveable between a lowered position and a raised position. The lifting member moves from a first end of the cable channel to a second end of the cable channel, when the sliding portion moves from the lowered position to the raised position.

20 Claims, 9 Drawing Sheets

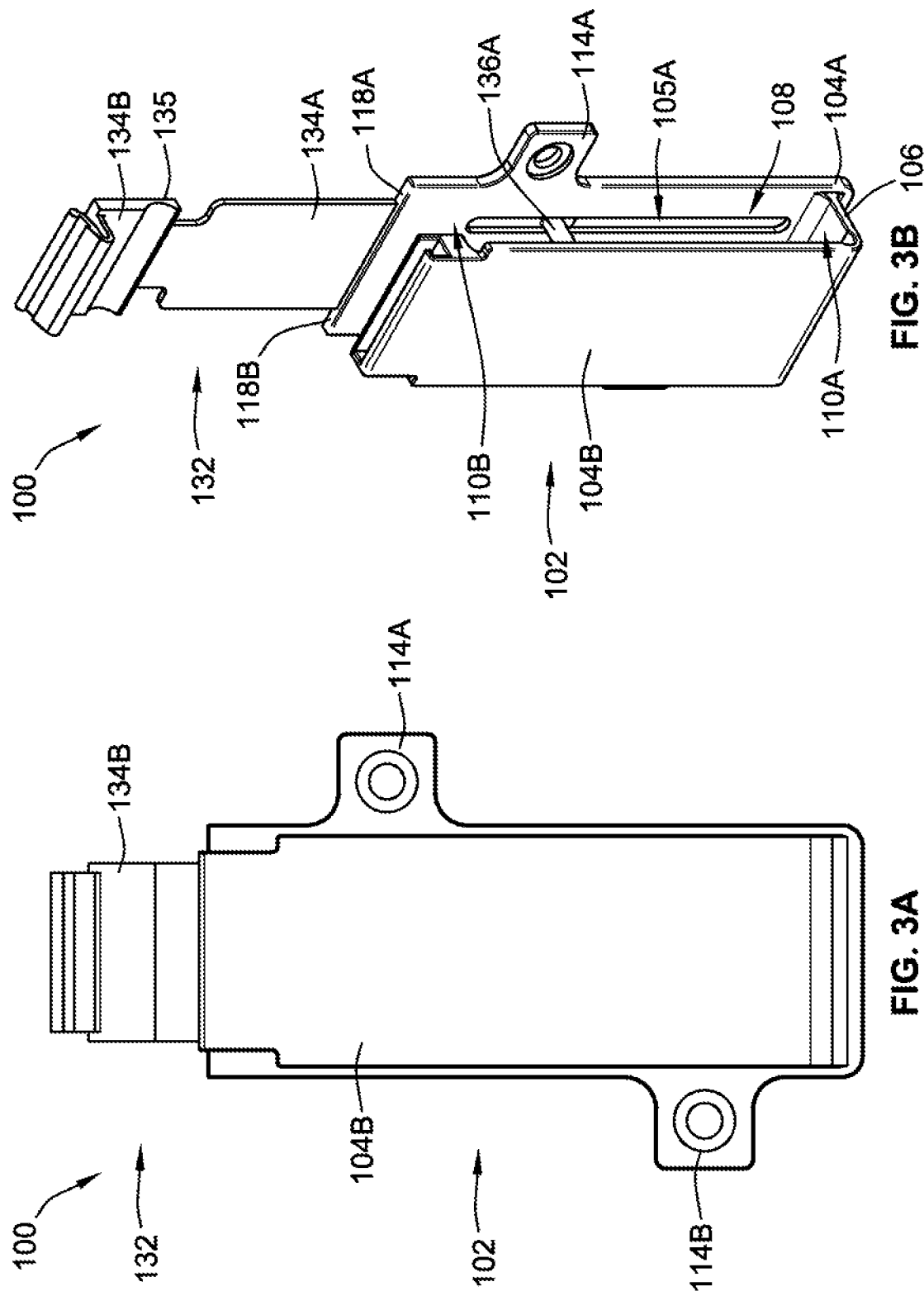

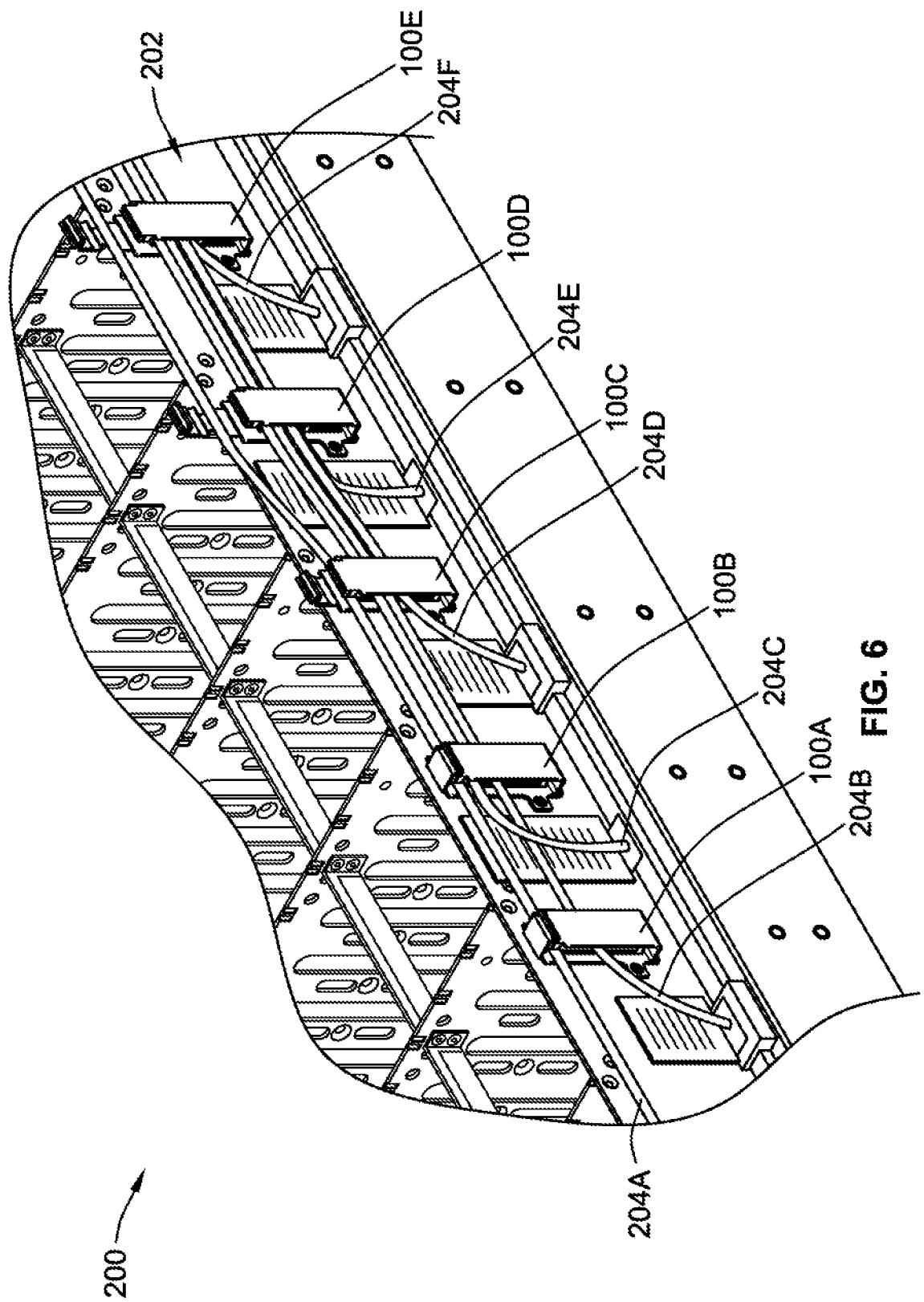

CLIP FOR SECURING CABLES AND PERFORMING CABLE MAINTENANCE

TECHNICAL FIELD

The present disclosure relates generally to systems and methods for securing cables in a cable aisle of a chassis. More particularly, aspects of this disclosure relate to a clip with a sliding portion that secures cables in the cable aisle, and is movable to lift cables out of the cable aisle to perform maintenance on the cables.

BACKGROUND

Computing devices generally include a chassis (e.g., a housing) and a variety of different electronic components positioned inside the chassis. FIG. 1 shows a conventional chassis 10 of a computing device. The chassis 10 includes a number of slots 12 into which electronics components can be inserted. The chassis 10 includes a cable aisle 14 defined at one end of the chassis 10. A number of cables 16A, 16B, 16C are positioned in the cable aisle 14. The cables 16A, 16B, 16C will be connected to the various electronic components positioned in the slots 12, when the computing device is used. FIG. 1 also illustrates a variety of prior art clips 18A, 18B, 18C, and 18D used to secure the cables 16A, 16B, 16C in the cable aisle 14. However, it can be difficult to remove any of the cables 16A, 16B, 16C when maintenance on those cables needs to be performed. Thus, there is a need for an improved clip to secure cables in a cable aisle of a chassis that allows for easier removal of the cables to perform maintenance.

SUMMARY

The various examples of the present disclosure are directed toward systems that include a clip for securing one or more cables in a cable aisle of a computing device. In a first embodiment of the present disclosure, the clip comprises a housing portion and a sliding portion. The housing portion has a first sidewall and a second sidewall that are coupled together by a base. A cable channel is defined between the first sidewall and the second sidewall. The cable channel is configured to accommodate the one or more cables. The sliding portion is coupled to the first sidewall of the housing portion. The sliding portion has a lifting member extending across the cable channel from the first sidewall to the second sidewall. The sliding portion is configured to be moveable between a lowered position and a raised position. The lifting member moves from a first end of the cable channel to a second end of the cable channel, when the sliding portion moves from the lowered position to the raised position.

In some examples of the first embodiment, movement of the lifting member from the first end of the cable channel to the second end of the cable channel moves at least a portion of the one or more cables from the first end of the cable channel to the second end of the cable channel.

In some examples of the first embodiment, movement of the lifting member from the first end of the cable channel to the second end of the cable channel causes at least a portion of at least one of the one or more cables to be removed from the cable channel.

In some examples of the first embodiment, the sliding portion is configured to transition between a locked configuration and an unlocked configuration when the sliding portion is in the lowered position.

In some examples of the first embodiment, the sliding portion prevents the one or more cables from being removed from the second end of the cable channel when the sliding portion is in the locked configuration.

In some examples of the first embodiment, the sliding portion allows the one or more cables to be removed from the second end of the cable channel when the sliding portion is in the unlocked configuration.

In some examples of the first embodiment, the sliding portion is not movable between the lowered position and the raised position when the sliding portion is in the locked configuration.

In some examples of the first embodiment, the sliding portion is movable between the lowered position and the raised position when the sliding portion is in the unlocked configuration.

In some examples of the first embodiment, the base of the housing portion is positioned at the first end of the cable channel, and the sliding portion includes a body and an upper end piece positioned adjacent to the first sidewall at the second end of the cable channel. The upper end piece is movable to transition the sliding portion between the locked configuration and the unlocked configuration.

In some examples of the first embodiment, the upper end piece of the sliding portion extends from the first sidewall toward the second sidewall when the sliding portion is in the locked position. The cable channel is closed at the first end by the base of the housing portion and closed at the second end by the upper end piece of the sliding portion.

In some examples of the first embodiment, the upper end piece of the sliding portion has a mating feature configured to mate with a corresponding mating feature on the second sidewall of the housing portion, to thereby secure the sliding portion in the locked position and secure the closing the second end of the cable channel.

In some examples of the first embodiment, the upper end piece of the sliding portion extends from the first sidewall away from the second sidewall when the sliding portion is in the unlocked position, such that the cable channel is open at the second end.

In some examples of the first embodiment, the upper end piece is positioned generally perpendicular to the body when the sliding portion is in the locked configuration, and the upper end piece is positioned generally parallel to the body when the sliding portion is in the unlocked position.

In some examples of the first embodiment, the upper end piece rotates relative to the body to transition the sliding portion between the locked configuration and the unlocked configuration.

In some examples of the first embodiment, the upper end piece is integrally formed with the body, and the upper end piece rotates relative to the body via a living hinge.

In some examples of the first embodiment, the upper end piece is formed separate from the body, and the upper end piece rotates relative to the body via a hinge or a pivot.

In some examples of the first embodiment, the upper end piece slides to transition the sliding portion between the locked configuration and the unlocked configuration.

In some examples of the first embodiment, the sliding portion is positioned adjacent to the housing such that the first sidewall is positioned between the sliding portion and the cable channel, and the lifting member extends from the sliding portion into the cable channel through a slot defined in the first sidewall. The lifting member is configured to move through both the cable channel and the slot defined in the first sidewall when the sliding portion is moved between the lowered position and the raised position.

In some examples of the first embodiment, the first sidewall of the housing portion defines a slot, and the sliding portion is configured to be inserted into the slot such that the lifting member extends across the cable channel from the first sidewall to the second sidewall.

In a second embodiment of the present disclosure, a computing device comprises a chassis, a cable aisle, one or more cables, and one or more clips. The chassis contains one or more electronic components. The cable aisle is at least partially defined by the chassis. The one or more cables are positioned in the cable aisle, and are each electrically connected to at least one of the electronic components. The one or more clips are positioned in the cable aisle, and are each configured to secure at least one of the one or more cables in the cable aisle. Each clip comprises a housing portion and a sliding portion. The housing portion has a first sidewall and a second sidewall that are coupled together by a base. A cable channel is defined between the first sidewall and the second sidewall. The cable channel is configured to accommodate the one or more cables. The sliding portion is coupled to the first sidewall of the housing portion. The sliding portion has a lifting member extending across the cable channel from the first sidewall to the second sidewall. The sliding portion is configured to be moveable between a lowered position and a raised position. When the sliding portion of each clip moves from the lowered position to the raised position, the lifting member of each clip removes a respective portion of the one or more cables from the cable aisle.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 3A is an end view of the example clip of FIG. 2 with a sliding portion coupled to a housing portion in a lowered position, according to aspects of the present disclosure;

FIG. 3B is a perspective view of the example clip of FIG. 2 with the sliding portion coupled to the housing portion in a raised position, according to aspects of the present disclosure;

FIG. 6 is a perspective view of the example clip of FIG. 2 securing cables in a cable aisle of a chassis of a computing device, according to aspects of the present disclosure.

Figure 1:
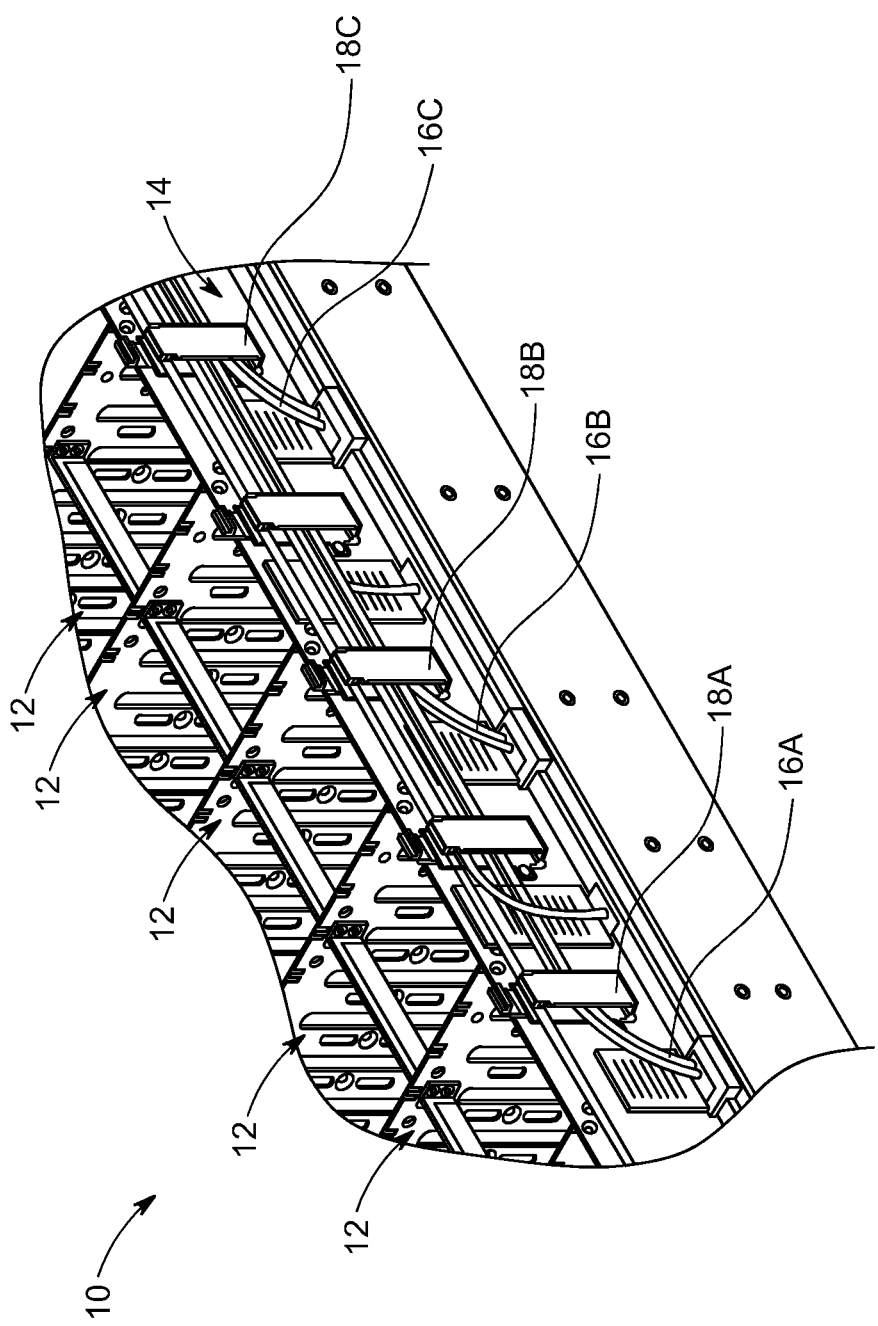
FIG. 1 is a perspective view of conventional prior art clips for securing cables in a cable aisle of a computing device.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 2:
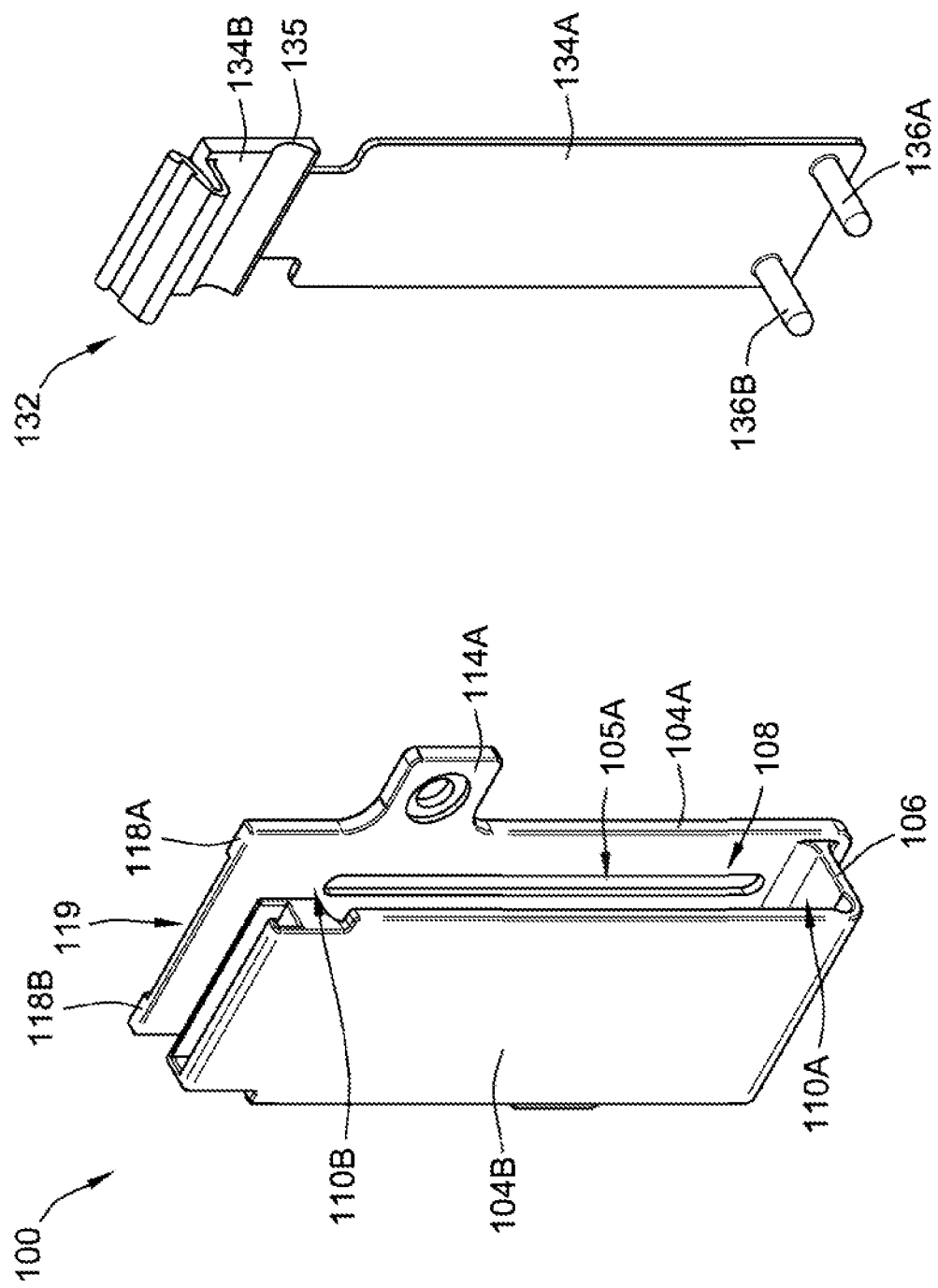
FIG. 2 is an exploded perspective view of an example clip for securing cables in a cable of a computing device, according to aspects of the present disclosure.
Figure 3C:
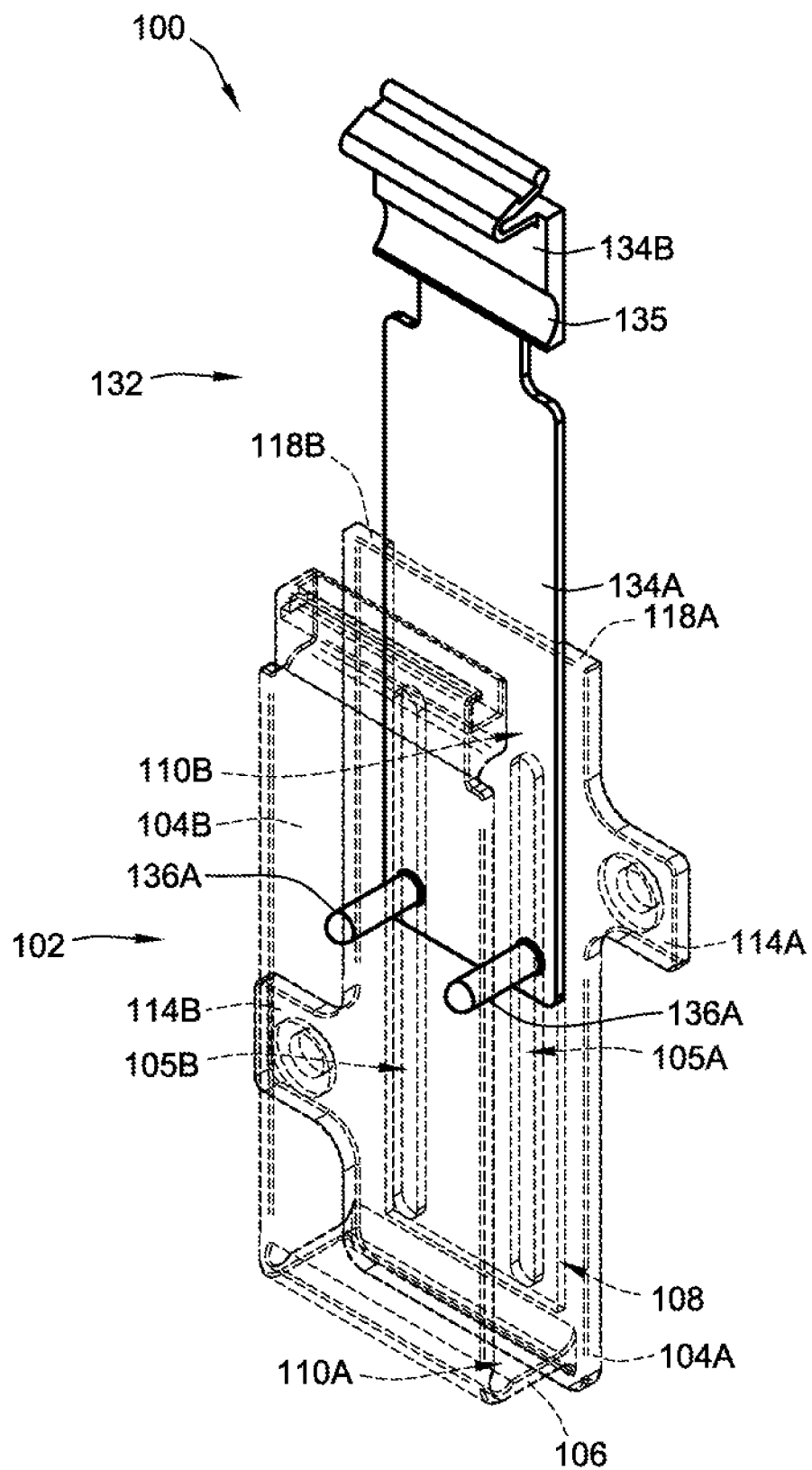
FIG. 3C is a transparent perspective view of the example clip of FIG. 2 with the sliding portion coupled to the housing portion in the raised position, according to aspects of the present disclosure.

FIG. 2 shows an exploded view of the components of an example clip 100 that can be used to secure cables in a cable aisle of a chassis of a computing device. The clip 100 includes a housing portion 102 and a sliding portion 132. The housing portion 102 includes a first sidewall 104A and a second sidewall 104B. The first sidewall 104A includes slots 105A and 105B (shown in FIG. 3C), through which part of the sliding portion 132 can extend (FIGS. 3B and 3C). The housing portion 102 also includes a base 106 that extends between interior sides of the first sidewall 104A and the second sidewall 104B. The first sidewall 104A and the second sidewall 104B are thus coupled together by the base 106. A cable channel 108 is defined between the first sidewall 104A and the second sidewall 104B. The cable channel 108 is sized to accommodate one or more cables. Thus, when the clip 100 is installed in the chassis of the computing device, one or more cables can be positioned in the cable channel 108. The first sidewall 104A includes an exterior side that includes tracks 118A and 118B on opposite sides that define a slot 119, into which the sliding portion 132 can be inserted.

Figure 5:
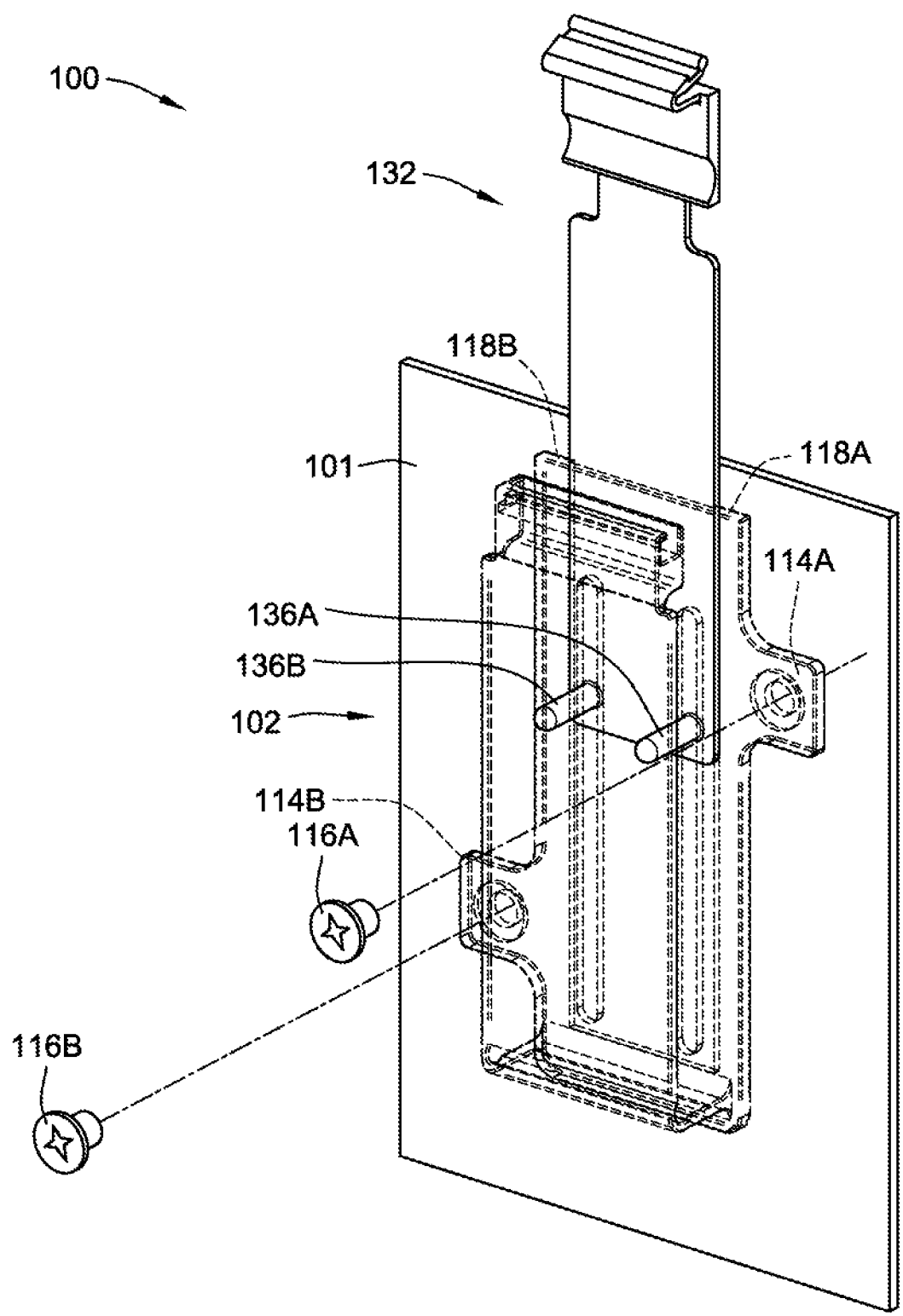
FIG. 5 is a perspective view of the example clip of FIG. 2 coupled to a wall structure of a chassis of a computing device, according to aspects of the present disclosure.

The cable channel 108 has a length that runs from a first end 110A to a second end 110B. In the illustrated implementation, the base 106 of the housing portion 102 is located at the first end 110A of the cable channel 108. As is shown in FIG. 5, the first end 110A of the cable channel 108 will generally be the lower end of the cable channel 108 when the clip 100 is installed in the chassis. Similarly, the second end 110B of the cable channel 108 will generally be the upper end of the cable channel 108 when the clip 100 is installed in the chassis. However, in other implementations, the clip 100 may be installed in different orientations, such that the first end 110A and second end 110B are upper and lower ends of the cable channel 108, left and right ends of the cable channel 108, or any other possible end or side of the cable channel 108. The housing portion 102 also includes an attachment point 114A that can be used to attach the clip 100 to the chassis. In some implementations, a screw or other fastener can be inserted through the attachment point 114A and into or through some portion of the chassis.

As shown in FIG. 2, the sliding portion 132 is formed from a body 134A and an upper end piece 134B. The sliding portion 132 includes one or more lifting members extending from the body 134A. In the illustrated implementation, the lifting members include bosses 136A and 136B. When the sliding portion 132 is coupled to the housing portion 102, boss 136A of the sliding portion 132 will extend through slot 105A of the housing portion 102. Similarly, boss 136B of the sliding portion 132 will extend through slot 105B of the housing portion 102. The sliding portion 132 is configured to translate between a lowered position (FIG. 3A) and a raised position (FIGS. 3B and 3C).

When the upper end piece 134B is in the lowered position, the upper end piece 134B is movable relative to the body 134A to transition the sliding portion 132 between a locked configuration and an unlocked configuration. In the illustrated implementation, the upper end piece 134B is integrally formed with the body 134A, and is rotatable relative to the body 134A via a living hinge 135. In other implementations, the upper end piece 134B can be a separate component from the body 134A, that is rotationally coupled to the body 134A via a hinge or pivot structure, or any other structure or linkage that allows for rotational movement. In still other implementations, the upper end piece 134B can be configured to slide or translate relative to the body 134A, to transition the sliding portion 132 between the locked configuration and the unlocked configuration.

FIGS. 3A, 3B, and 3C show the clip 100 when the sliding portion 132 is coupled to the housing portion 102. FIG. 3A shows a view of the clip 100 facing the second sidewall 104B. In FIG. 3A, the sliding portion 132 is coupled to the housing portion 102, while in the lowered position and the unlocked configuration. FIGS. 3B and 3C show the sliding portion 132 inserted into the slot 119 of the housing portion, to thereby couple the sliding portion 132 to the housing portion 102. In FIG. 3B, the sliding portion 132 is in the raised position. FIG. 3C also shows the sliding portion 132 in the raised position, but with the housing portion 102 transparent, so that the bosses 136A and 136B are visible. As shown in FIG. 3A, when the sliding portion 132 is in the lowered positioned and the unlocked configuration, the upper end piece 134B extends above the housing portion 102.

In FIGS. 3B and 3C, the sliding portion 132 has been moved to the raised position. In the raised position, both the upper end piece 134B, as well as a substantial portion of the body 134A, extend above the housing portion 102. In the illustrated implementation, the sliding portion 132 is translationally or slidably coupled to the housing portion 102 to move between the lowered position and the raised position. However, in other implementations, the clip 100 can be configured so that the sliding portion 132 undergoes a different type of movement to move the sliding portion 132 between the raised position and the lowered position.

As shown in FIGS. 3B and 3C, the sliding portion 132 is positioned adjacent to the first sidewall 104A, such that the first sidewall 104A is positioned between the sliding portion 132 and the cable channel 108. The boss 136A of the sliding portion 132 extends from the sliding portion 132, through slot 105A in the first sidewall 104A, and into and across the cable channel 108 (FIGS. 3B and 3C). Similarly, boss 136B of the sliding portion 132 extends from the sliding portion 132, through slot 105B in the first sidewall 104A, and into and across the cable channel 108 (FIG. 3C). Generally, bosses 136A and 136B extend substantially all of the way across the cable channel 108 from the first sidewall 104A to the second sidewall 104B. However, in other implementations, the bosses 136A and 136B could extend through a portion of the distance between the first sidewall 104A and the second sidewall 104B.

FIGS. 3A, 3B, and 3C also illustrate the attachment points of the housing portion 102 used to couple the clip 100 to a portion of the chassis. The housing portion 102 includes attachment point 114A (also shown in FIG. 2) and attachment point 114B. The attachment points 114A and 114B can be used to attach the clip 100 to a portion of the chassis.

Figure 4A:
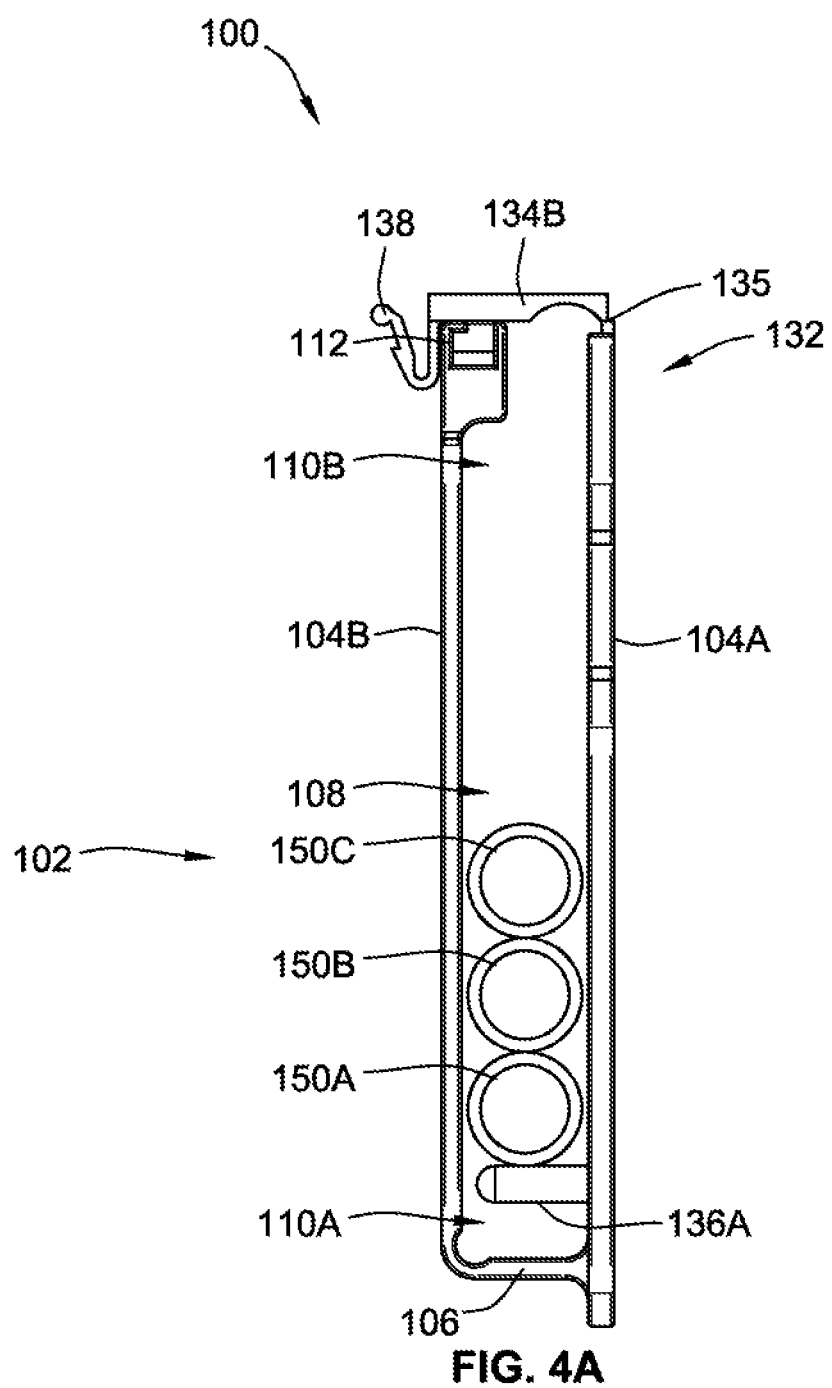
FIG. 4A is a side view of the example clip of FIG. 2 with the sliding portion in the lowered position and in a locked configuration, according to aspects of the present disclosure.
Figure 4B:
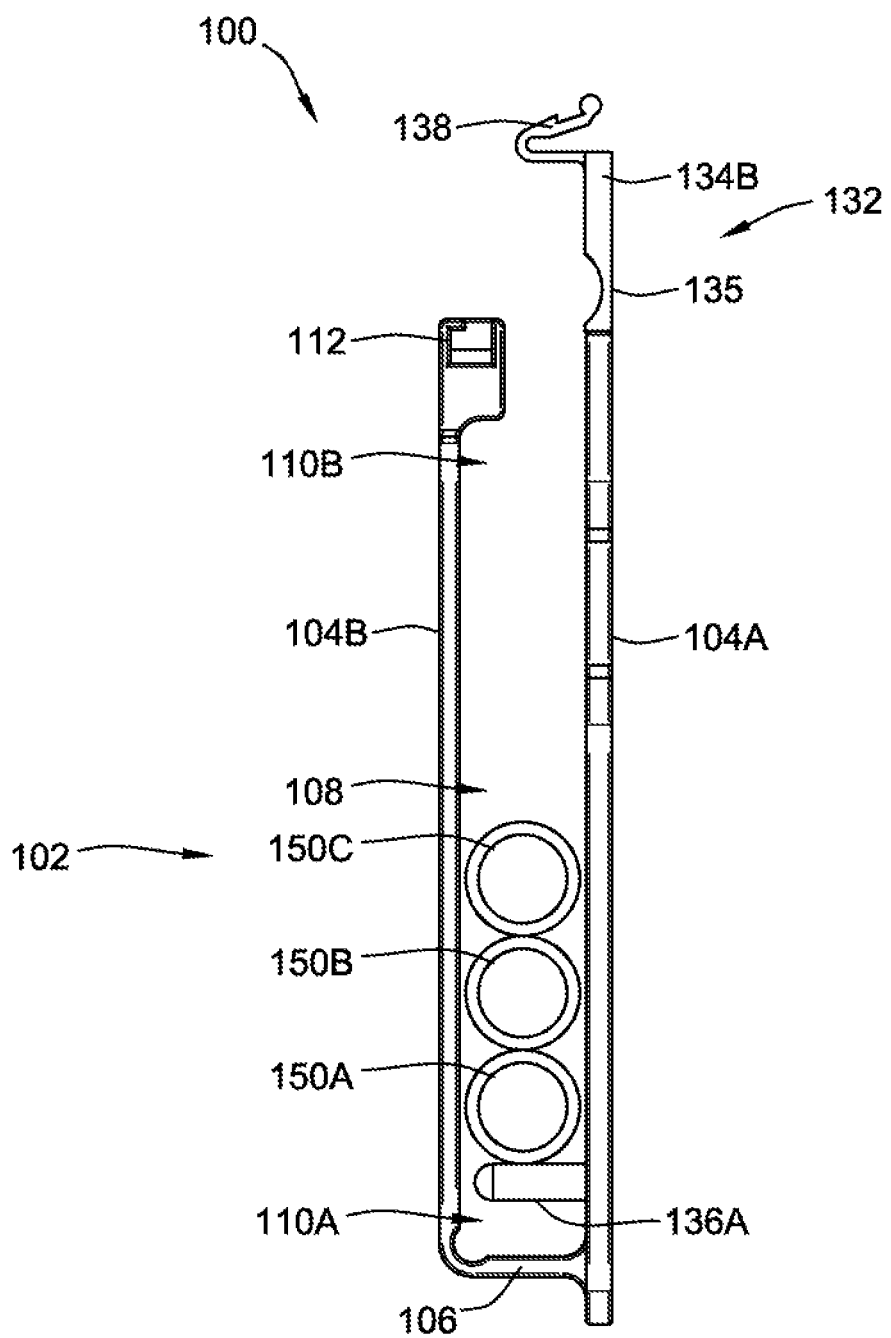
FIG. 4B is a side view of the example clip of FIG. 2 with the sliding portion in the lowered position and in an unlocked configuration, according to aspects of the present disclosure.
Figure 4C:
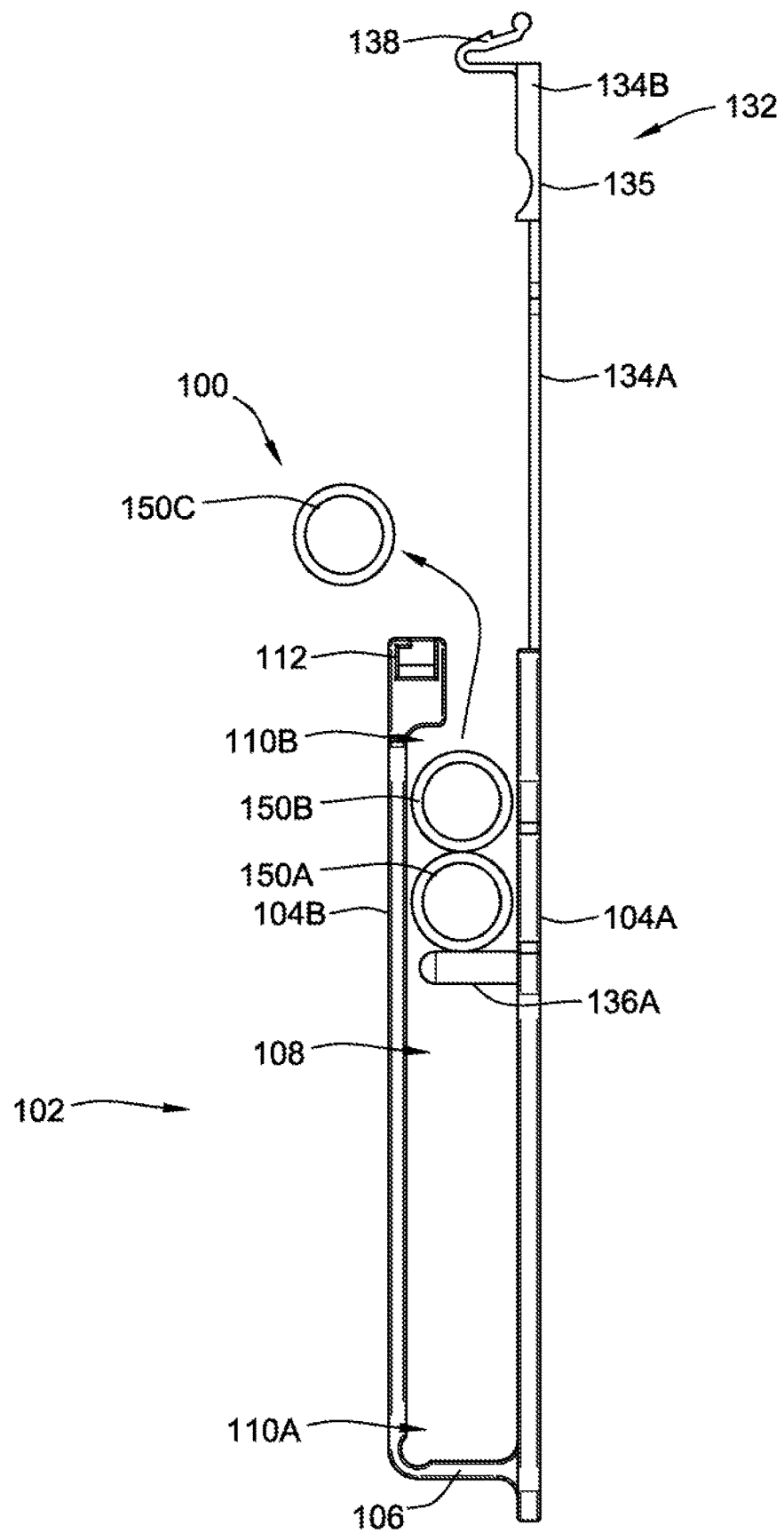
FIG. 4C is a side view of the example clip of FIG. 2 with the sliding portion in the raised position, according to aspects of the present disclosure.

FIGS. 4A, 4B, and 4C illustrate how movement of the sliding portion 132 between the locked configuration and the unlocked configuration, and between the lowered position and the raised position, can be used to allow the removal of cables from the cable channel 108. In FIG. 4A, the sliding portion 132 is coupled to the housing portion 102 and in the lowered position. Boss 136A is positioned at the first end 110A of the cable channel 108, and extends across the cable channel 108 from the first sidewall 104A to the second sidewall 104B. Boss 136B is not visible in the side views illustrated in FIGS. 4A, 4B, and 4C, but the positions and movements of boss 136B mirror those of boss 136A, except that bosses 136A and 136B extend through different slots 105A, 105B of the housing portion 102, as shown in FIG. 3C.

Cables 150A, 150B, and 150C are positioned in the cable channel 108 at the first end 110A. Cable 150A is positioned on top of boss 136A, and cables 150B and 150C are stacked on top of cable 150A. Although three cables are shown, greater or fewer than three cables may be positioned in the cable channel 108. Further, the cables may be next to each other within the cable channel 108, instead of on top of each other. The upper end piece 134B of the sliding portion 132 is positioned at the second end 110B of the cable channel 108, and has been moved to the locked configuration by rotating via the living hinge 135. Because the sliding portion 132 is in the locked configuration, the upper end piece 134B extends from the first sidewall 104A to the second sidewall 104B, and is coupled to the second sidewall 104B. The upper end piece 134B is generally perpendicular to the body 134A of the sliding portion 132. In this manner, the cable channel 108 is closed at the first end 110A and at the second end 110B. The cable channel 108 is closed at the first end by the base 106 of the housing portion 102, and the bosses 136A and 136B of the sliding portion. The cable channel 108 is closed at the second end 110B by the upper end piece 134B of the sliding portion 132.

The upper end piece 134B can have a mating feature 138 that is configured to mate with a corresponding mating feature 112 of the housing portion 102, such that the upper end piece 134B is coupled to the second sidewall 104B. In the implementation illustrated in FIG. 4A, mating feature 138 of the upper end piece 134B can be a resilient tongue that fits over the housing portion 102. The mating feature 112 of the housing portion 102 is the upper end of the second sidewall 104B. The resilient tongue (e.g., the mating feature 138) can interact with the upper end of the second sidewall 104B (e.g., the mating feature 112) via a friction fit, so that the upper end piece 134B is friction locked to the second sidewall 104B, and cannot inadvertently move from the locked configuration to the unlocked configuration. Thus, the mating features 112, 138 secure the sliding portion 132 in the locked configuration, and secure the closing of the second end 110B of the cable channel 108. Other types of mating features 112, 138 can be used in other implementations. For example, mating feature 138 could be a clip that fastens to an attachment point on the second sidewall 104B that forms mating feature 112. Thus, in these implementations, a friction fit is not used to secure the sliding portion 132 in the locked configuration.

In some implementations, when the sliding portion 132 in in the locked configuration, the sliding portion 132 is not movable between the lowered position and the raised position. In other implementations, however, the sliding portion 132 can still be moved from the lowered position to the raised position. Raising the sliding portion 132 from the lowered position will cause the upper end piece 134B to decouple from the second sidewall 104B, such that the sliding portion 132 is no longer in the locked configuration. As shown in FIG. 4A, when the sliding portion 132 is in the lowered position and the locked configuration, the sliding portion 132 prevents the cables 150A, 150B, and 150C from being removed from the cable channel 108.

In FIG. 4B, the upper end piece 134B of the sliding portion 132 has rotated away from the second sidewall 104B via the living hinge 135, such that the sliding portion 132 is in the unlocked configuration. In the illustrated implementation, the upper end piece 134B extends from the first sidewall 104A directly upward away from the second sidewall 104B, so that the upper end piece 134B is generally parallel to the body 134A of the sliding portion 132. However, the upper end piece 134B can generally extend from the first sidewall 104A away from the second sidewall 104B in any suitable manner or direction, so long as the upper end piece 134B is no longer coupled to the second sidewall 104B. Thus, when the sliding portion 132 is in the lowered position, the upper end piece 134B can be attached to or loosened from the second sidewall 104B, to transition the sliding portion 132 between the locked configuration and the unlocked configuration. When the sliding portion 132 is in the unlocked position, the cable channel 108 is open at the second end 110B.

In FIG. 4C, the sliding portion 132 has been moved to the raised position. In the illustrated implementation, the sliding portion 132 translates or slides from the lowered position to the raised position. However, other types of movement can also occur in other implementations. As the sliding portion 132 moves to the raised position, the bosses 136A and 136B move from the first end 110A of the cable channel 108 toward the second end 110B of the cable channel 108. Generally, the bosses 136A and 136B move through both the cable channel 108 and the slots 105A and 105B (FIGS. 3B and 3C) in the first sidewall 104A, when the sliding portion 132 is moved between the lowered and the raised position.

As the bosses 136A and 136B move upwards, the bosses 136A and 136B lift the cables 150A, 150B, and 150C upwards toward the second end 110B of the cable channel 108. In some implementations, moving the bosses 136A and 136B to the raised position by itself can cause any of the cables 150A, 150B, and 150C (such as cable 150C as shown in FIG. 4C) to be forced out of the cable channel 108. In other implementations, moving the bosses 136A and 136B to the raised position raises the cables 150A, 150B, and 150C to the second end 110B of the cable channel 108. Once the cables 150A, 150B, and 150C are raised to the second end 110B of the cable channel 108, the cables 150A, 150B, and 150C can be manually removed from the cable channel 108 by a user. In any of the implementations, because the sliding portion 132 is in the unlocked configuration and the upper end piece 134B is not coupled to the second sidewall 104B, the cables 150A, 150B, and 150C can be removed from the second end 110B of the cable channel 108.

Thus, once the sliding portion 132 has been moved to the raised position, the cables 150A, 150B, and 150C are either automatically removed from the cable channel 108 of the clip 100, or are positioned at the second end 110B of the cable channel 108, such that a user or technician can manually remove the cables 150A, 150B, and 150C from the cable channel 108 of the clip 100. The clip 100 allows for the user or technician to more easily repair or replace the cables 150A, 150B, and 150C.

FIG. 5 shows the clip 100 coupled to a wall structure 101 of a chassis of a computing device. As shown, fasteners 116A and 116B can be inserted through attachment points 114A and 114B to secure the housing portion 102 to the wall structure 101. In some implementations, the sliding portion 132 is coupled to the housing portion 102 by being inserted into the slot 119 defined between tracks 118A and 118B of the first sidewall 104A. In other implementations, the sliding portion 132 is additional or alternatively coupled to the housing portion 102 by being held in place between the wall structure 101 and the housing portion 102, with bosses 136A and 136B extending into the cable channel 108.

In some implementations, the attachment points 114A and 114B are threaded holes, and the fasteners 116A and 116B are screws. The screws can be inserted through the threaded holes and into corresponding threaded holes in one or more portions of the chassis of the computing device, to attach the clip 100 to the chassis. Other types of fasteners and attachment points can also be used.

FIG. 6 shows an example chassis 200 configured to hold one or more electronic components. The chassis 200 defines a cable aisle 202 at one end of the chassis. Clips 100A-100E are positioned in the cable aisle 202. Clips 100A-100E can be identical to the example clip 100 shown in FIGS. 2-5. The chassis 200 further includes cables 204A-204F positioned in the cable aisle 202. The cables 204A-204F can be electrically connected to any one or more of the electronic components.

As shown, the cables 204A-204F can be held by one or more of the clips 100A-100E, depending on where the cables 204A-204F enter the cable aisle 202. Cables 204A and 204B are held by each clip 100A-100E. Cable 204C enters the cable aisle 202 past clip 100A, and is thus only held by clips 100B-100E. In a similar fashion, cable 204D is held by clips 100C-100E; cable 204E is held by clips 100D and 100E; and cable 204F is held by clip 100E. Thus, any of the clips 100A-100E can hold any number of cables 204A-204F. While FIG. 6 shows five clips 100A-100E and six cables 204A-204F, any number of clips and cables can be used, depending on the specific requirements of the computing device. For illustrative purposes, clips 100A-100C are shown in the lowered position, while clips 100D and 100E are shown in the raised position. Clips 100A and 100B are in the locked configuration, thereby preventing clips 100A and 100B from being moved to the raised position. Clip 100C is in the unlocked position, thereby allowing a technician to move clip 100C to the raised position and remove any of cables 204A-204D being held by clip 100C.

In order to perform maintenance on any of the cables, such as by repairing or replacing the cable, any of the clips 100A-100E can be unlocked and moved to the raised position, which will cause one or more of the cables 204A-204F to be lifted out of the cable aisle. Thus, if a technician wishes to service any of the cables 204A-204F, the technician begins by unlocking any required clips 100A-100E. If the entire cable needs to be replaced, the technician will unlock every clip that is holding the cable. Thus, if the technician wishes to replace cable 204A, the technician will need to unlock all of the clips 100A-100E. But if the technician wishes to replace cable 204F, the technician would only need to unlock clip 100E. In other scenarios, the technician may only need to repair one portion of a cable. The technician would thus need to unlock only the clip or clips required to repair that portion of the cable. For example, if the portion of cable 204A between clip 100C and 100D needed to be repaired, the technician would only need to unlock clip 100C and clip 100D.

Once the required clips are unlocked, the technician can move the required clips from the lowered position to the raised position to remove the target cable from the clips, and from the cable aisle 202 itself. In some implementations, the technician may be required to raise the target clips all the way to the raised position, such that every cable held by the target clips is or can be removed from the clips and the cable aisle 202. For example, if the cable being serviced is held at the bottom of a specific clip, the technician would need to remove all of the other cables from the clip by fulling moving the clip to the raised position. But if the cable being serviced is held at the top of the clip, the technician may only need to move that clip slightly away from the lowered position toward the raised position in order to remove the cable from the clip and the cable aisle 202.

Once the cable or portion of cable has been removed from the required clip(s), the technician can service the cable, by repairing it or replacing it. While this service is being performed, the clips can be moved back to their lowered positions and locked configurations. Doing so will prevent any of the other cables remaining in the cable aisle 202 from inadvertently being removed from the cable aisle 202 while the removed cable is being serviced.

Once the removed cable has been repaired or replaced, that cable can be placed back into the required clips. If the clips were lowered and locked after the cable was removed, the clips can be unlocked and raised in order to insert the serviced cable back into the clips. In other implementations, the clips do not need to be moved to the raised position in order to insert the serviced cable. Instead, the serviced cable can be inserted into the required clips when those clips are still in the lowered position, so long as those clips are unlocked.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A clip for securing one or more cables in a cable aisle of a computing device, the clip comprising:
    a housing portion having a first sidewall and a second sidewall, the first sidewall and the second sidewall being coupled together by a base, the housing portion defining a cable channel between the first sidewall and the second sidewall, the cable channel being configured to accommodate the one or more cables; and
    a sliding portion coupled to the first sidewall of the housing portion, the sliding portion having a lifting member extending across the cable channel from the first sidewall to the second sidewall, the sliding portion being configured to be movable between a lowered position and a raised position,
    wherein movement of the sliding portion from the lowered position to the raised position causes the lifting member to move from a first end of the cable channel to a second end of the cable channel.

2. The clip of claim 1, wherein movement of the lifting member from the first end of the cable channel to the second end of the cable channel moves at least a portion of the one or more cables from the first end of the cable channel to the second end of the cable channel.

3. The clip of claim 2, wherein movement of the lifting member from the first end of the cable channel to the second end of the cable channel causes at least a portion of at least one of the one or more cables to be removed from the cable channel.

4. The clip of claim 1, wherein the sliding portion is configured to transition between a locked configuration and an unlocked configuration when the sliding portion is in the lowered position.

5. The clip of claim 4, wherein the sliding portion prevents the one or more cables from being removed from the second end of the cable channel when the sliding portion is in the locked configuration.

6. The clip of claim 5, wherein the sliding portion allows the one or more cables to be removed from the second end of the cable channel when the sliding portion is in the unlocked configuration.

7. The clip of claim 4, wherein the sliding portion is not movable between the lowered position and the raised position when the sliding portion is in the locked configuration.

8. The clip of claim 7, wherein the sliding portion is movable between the lowered position and the raised position when the sliding portion is in the unlocked configuration.

9. The clip of claim 4, wherein the base of the housing portion is positioned at the first end of the cable channel, and wherein the sliding portion includes a body and an upper end piece positioned adjacent to the first sidewall at the second end of the cable channel, the upper end piece being movable to transition the sliding portion between the locked configuration and the unlocked configuration.

10. The clip of claim 9, wherein the upper end piece of the sliding portion extends from the first sidewall toward the second sidewall when the sliding portion is in the locked position, such that the cable channel is closed at the first end by the base of the housing portion and closed at the second end by the upper end piece of the sliding portion.

11. The clip of claim 10, wherein the upper end piece of the sliding portion has a mating feature configured to mate with a corresponding mating feature on the second sidewall of the housing portion, to thereby secure the sliding portion in the locked position and secure the closing the second end of the cable channel.

12. The clip of claim 10, wherein the upper end piece of the sliding portion extends from the first sidewall away from the second sidewall when the sliding portion is in the unlocked position, such that the cable channel is open at the second end.

13. The clip of claim 12, wherein the upper end piece is positioned generally perpendicular to the body when the sliding portion is in the locked configuration, and wherein the upper end piece is positioned generally parallel to the body when the sliding portion is in the unlocked position.

14. The clip of claim 9, wherein the upper end piece rotates relative to the body to transition the sliding portion between the locked configuration and the unlocked configuration.

15. The clip of claim 14, wherein the upper end piece is integrally formed with the body, and wherein the upper end piece rotates relative to the body via a living hinge.

16. The clip of claim 14, wherein the upper end piece is formed separate from the body, and wherein the upper end piece rotates relative to the body via a hinge or a pivot.

17. The clip of claim 9, wherein the upper end piece slides to transition the sliding portion between the locked configuration and the unlocked configuration.

18. The clip of claim 1, wherein the sliding portion is positioned adjacent to the housing portion such that the first sidewall is positioned between the sliding portion and the cable channel, and wherein the lifting member extends from the sliding portion into the cable channel through a slot defined in the first sidewall, the lifting member being configured to move through both the cable channel and the slot defined in the first sidewall when the sliding portion is moved between the lowered position and the raised position.

19. The clip of claim 1, wherein the first sidewall of the housing portion defines a slot, and wherein the sliding portion is configured to be inserted into the slot such that the lifting member extends across the cable channel from the first sidewall to the second sidewall.

20. A computing device comprising:

a chassis containing one or more electronic components;

a cable aisle defined at least partially by the chassis;

one or more cables positioned in the cable aisle, each of the one or more cables being electrically connected to at least one of the one or more electronic components; and one or more clips positioned in the cable aisle, each of the one or more clips being configured to secure at least one of the one or more cables in the cable aisle, each of the one or more clips including:

a housing portion having a first sidewall and a second sidewall, the first sidewall and the second sidewall being coupled together by a base, the housing portion defining a cable channel between the first sidewall and the second sidewall, the cable channel being configured to accommodate the one or more cables; and a sliding portion coupled to the first sidewall of the housing portion, the sliding portion having a lifting member extending across the cable channel from the first sidewall to the second sidewall, the sliding portion being configured to be movable between a lowered position and a raised position, wherein movement of the sliding portion of each of the one or more clips from the lowered position to the raised position causes the lifting member of each of the one or more clips to remove a respective portion of the one or more cables from the cable aisle.

* * * * *